United States Patent [19]
Seki

[11] 3,940,665
[45] Feb. 24, 1976

[54] CHASSIS DEVICE HAVING VENTED BASE AND RADIATION MEMBER FOR SUPPORTING HEAT SOURCES

[75] Inventor: Hideki Seki, Saijo, Japan

[73] Assignee: Matsushita Electric Industrial Co., Ltd., Osaka, Japan

[22] Filed: July 3, 1974

[21] Appl. No.: 485,613

Related U.S. Application Data
[63] Continuation of Ser. No. 337,695, March 2, 1973.

[30] Foreign Application Priority Data
Mar. 6, 1972   Japan.............................. 47-27699

[52] U.S. Cl.................. 317/100; 165/80; 174/16 R
[51] Int. Cl.² ........................................ H05K 7/20
[58] Field of Search......... 317/100, 101 D, 101 DH; 174/15 R, 16 R, DIG. 5; 165/59, 104, 80; 98/58, 60

[56] References Cited
UNITED STATES PATENTS

| | | |
|---|---|---|
| 3,201,654 | 8/1965 | Clark et al. ........................ 317/100 |
| 3,236,296 | 2/1966 | Dubin ................................... 165/80 |
| 3,462,553 | 8/1969 | Spranger............................. 317/100 |
| 3,467,892 | 9/1969 | Sprude................................ 317/117 |

*Primary Examiner*—Gerald P. Tolin
*Attorney, Agent, or Firm*—Stevens, Davis, Miller & Mosher

[57] ABSTRACT

A chassis device comprising a radiator member vertically mounted on a chassis base and having a U-shaped cross section, a printed circuit board extending parallel to the bridging portion of the radiator member and secured to the opposite edges thereof, the radiator member carrying one or more heat source element such as transistors mounted on the side of the radiator member facing the printed circuit board, the chassis base being formed with vents in the portion of the chassis base surrounded by the radiator member and the printed circuit board.

2 Claims, 3 Drawing Figures

CHASSIS DEVICE HAVING VENTED BASE AND RADIATION MEMBER FOR SUPPORTING HEAT SOURCES

This is a continuation of application Ser. No. 337,695, filed Mar. 2, 1973.

FIELD OF THE INVENTION

This invention relates to the mounting of printed circuit boards and the heat radiating structure of the radiator member.

SUMMARY OF THE INVENTION

The object of this invention is to simply and inexpensively achieve the mounting of printed circuit boards and permit effective heat radiation from heat source elements such as transistors.

DESCRIPTION OF THE PREFERRED EMBODIMENT

Figure 1:
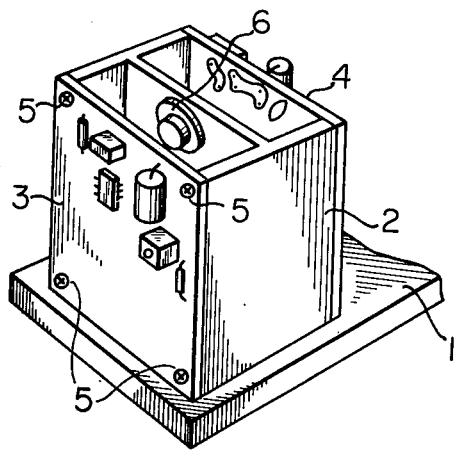
FIG. 1 is a perspective view of one embodiment of a chassis device according to the invention.

Referring to the drawing, a heat radiator member 2 having an H-shaped cross section is erected on a chassis base 1. Two printed circuit boards 3 and 4 extend parallel to the bridging portion of the radiator member 2, and are secured to the edges of the leg portions thereof by means of screws 5. Heat source elements such as transistors 6 and 7 are mounted on the radiator member 2 on the surfaces thereof opposing the printed circuit boards 3 and 4. Air holes or vents 8 and 9 are formed in portions of the chassis base 1 surrounded by the radiator member 2 and printed circuit boards 3 and 4.

In the construction described above, where the printed circuit boards 3 and 4 are mounted on the radiator member 2, the mounting of the printed circuit boards is facilitated and requires no particular member or the like for the mounting, so that it can be done inexpensively. Also, since the printed circuit boards 3 and 4 extend parallel to the bridging portion of the radiator member 2, they can provide the chassis device with a much improved space factor. Further, low temperature air below the chassis 1 can rise through the air holes 8 and 9 by virtue of a chimney structure of this device, thus providing for heat convection by the rising air in addition to the heat concuction by the radiator member 2, so that very effective radiation or divergence of heat from the transistors 6 and 7 can be obtained. Furthermore, the radiator member 2 intervening between the two printed circuit boards 3 and 4 serves as a shield to eliminate interference between the printed circuit boards 3 and 4. Moreover, since the printed circuit boards extend upright from the chassis base 1, dust is less likely to accumulate, which is effective from the standpoint of minimizing troubles.

Figure 2:
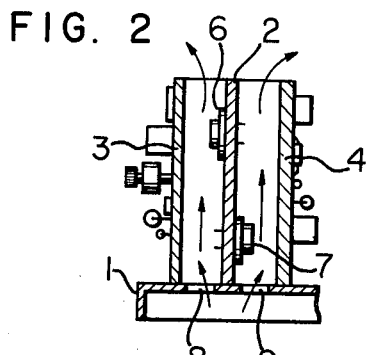
FIGS. 2 and 3 show, respectively in a sectional view and a top view, the same chassis device.
Figure 3:
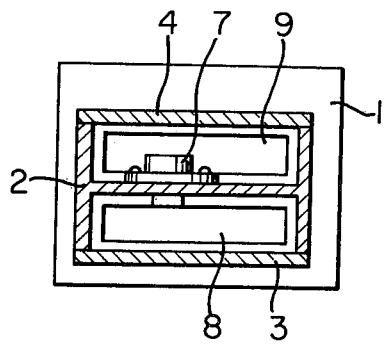

While the preceding embodiment of FIGS. 1 to 3 have used the H-shaped radiator member, similar effects of the invention can be obtained in the case where a single printed circuit board is secured to a radiator member having a U-shaped cross section. The H-shaped radiator member can be regarded to be equivalent to two U-shaped radiator members assembled together back to back.

As has been described in the foregoing, according to the invention it is possible to easily and inexpensively achieve the mounting of printed circuit boards, while obtaining effective heat radiation of heat source elements such as transistors. Also, the space factor can be much improved.

I claim:

1. A heat dissipation divice comprising a chassis base defining an air space therebelow and having at least one vent formed in a part thereof; at least one U-shaped heat radiation member attached to the upper surface of said chassis base, said member having a bridging portion and a pair of spaced parallel leg portions extending from both ends of said bridging portion for mounting thereon at least one heat source circuit element, each of said bridging and leg portions extending vertically upward from said chassis base and partially surrounding said vent on said chassis base; a printed circuit board extending across the opening between the leg portions of said U-shaped heat radiation member and attached to said leg portions and closing said opening by contacting the top of said chassis, said board and member forming therebetween an air flowing channel space connected to said vent, a heat source element being provided in said channel space and attached directly to the inside surface of the bridging portion of said radiation member opposite to said printed circuit board, the vertically upwardly extending bridging and leg portions of said heat radiation member having inside and outside heat radiation surfaces sufficient for radiating heat absorbed from said heat source element toward the ambient air space, the sizes of said printed circuit board and radiation member being sufficient to allow air flow from the air space below said chassis through said vent and said channel space to remove heat from said heat source circuit element and from the inside heat radiation surfaces of said bridging and leg portions.

2. A heat dissipation device comprising a chassis base defining an air space therebelow and having at least first and second vents formed therein;
   a pair of U-shaped heat radiation members assembled back-to-back to form an H-shaped heat radiation member attached to the upper surface of said chassis base, said H-shaped member having a bridging portion, a first pair of spaced parallel leg portions extending from one side of said bridging portion and a second pair of spaced parallel leg portions extending from the other side of said bridging portion, said bridging portion and said first pair of spaced parallel leg portions extending vertically upward from said chassis base 6 and partially surrounding said second vent on said chassis base;
   first and second printed circuit boards attached to said leg portions and extending across the openings between the first and second pairs respectively of the leg portions of said H-shaped heat radiation member and closing said openings by contacting the top of said chassis, said boards and member forming therebetween an air flowing channel space connected to said first and second vents; and
   at least one heat source element provided in at least one of said channel spaces and attached directly to a surface of the bridging portion of said H-shaped heat radiation member opposite to one of said first and second printed circuit boards, the vertically upwardly extending bridging and leg portions of said H-shaped heat radiation member having inside and outside heat radiation surfaces sufficient for radiating heat absorbed from said heat source toward the ambient air space, the sizes of said printed circuit boards and H-shaped radiation member being sufficient to allow air flow from the air space below said chassis through said vents and said channel spaces to remove heat from said heat source circuit element and from the inside heat radiation surfaces of the bridging and leg portions of said H-shaped member.

* * * * *